US011171443B2

(12) United States Patent
Regnier (10) Patent No.: US 11,171,443 B2
(45) Date of Patent: Nov. 9, 2021

(54) CONNECTOR SYSTEM WITH THERMAL COOLING (71) Applicant: Molex, LLC, Lisle, IL (US)

(72) Inventor: Kent E. Regnier, Lombard, IL (US)

(73) Assignee: Molex, LLC, Lisle, IL (US)

( * ) Notice: Subject to any disclaimer, the term of this patent is extended or adjusted under 35 U.S.C. 154(b) by 1622 days.

(21) Appl. No.: 13/672,130

(22) Filed: Nov. 8, 2012

(65) Prior Publication Data

US 2013/0114211 A1 May 9, 2013

Related U.S. Application Data (60) Provisional application No. 61/556,890, filed on Nov. 8, 2011, provisional application No. 61/640,786, filed on May 1, 2012.

(51) Int. Cl.
*H01R 13/533* (2006.01)
*F28F 3/02* (2006.01)
*G02B 6/42* (2006.01)
*H05K 7/20* (2006.01)

(52) U.S. Cl.
CPC ............ *H01R 13/533* (2013.01); *F28F 3/02* (2013.01); *G02B 6/4201* (2013.01); *H05K 7/20509* (2013.01)

(58) Field of Classification Search
CPC ............... H01R 13/648; H01R 13/533; H01R 13/6594; H01R 12/73; F28F 3/02; G02B 6/4201; H05K 7/20509
See application file for complete search history.

(56) References Cited

U.S. PATENT DOCUMENTS

| 5,479,321 | A | * | 12/1995 | Mair | H01R 23/6873 361/796 |
| 5,725,386 | A | * | 3/1998 | Davis | H01R 13/7031 439/79 |
| 6,398,587 | B1 | * | 6/2002 | Chen | H01R 12/7023 439/607.35 |
| 6,517,382 | B2 | * | 2/2003 | Flickinger | H05K 9/0058 439/439 |
| 6,666,694 | B1 | * | 12/2003 | Daly | H01R 23/6873 439/547 |
| 6,695,622 | B2 | * | 2/2004 | Korsunsky | H01R 31/06 439/631 |
| 6,866,544 | B1 | * | 3/2005 | Casey | H05K 9/0058 439/607.2 |
| 6,879,486 | B1 | * | 4/2005 | Banton | H05K 7/20563 165/185 |

(Continued)

OTHER PUBLICATIONS

Kerafol; Keratherm—Thermal Grease KP 92, KP 97, KP 12 (silicone free); last updated: Feb. 2008; accessed online http://www.produktinfo.conrad.com/datenblaetter/175000-199999/189999-da-01-en-WAERMELEITPASTE_KP97_30_GRAMM.pdf.*

*Primary Examiner* — Gordon A Jones (57) ABSTRACT

A connector includes a heat spreader. The heat spreader is configured to direct heat from ports to a thermal plate that is spaced apart from the connector. A plurality of connectors can be supported and a heat spreader can be associated with each connector. One or more thermal plates can be thermally coupled to the corresponding heat spreader(s) so as to direct thermal energy away from each connector. Cold blocks can be used to thermally couple the heat spreader to the corresponding thermal plates.

14 Claims, 12 Drawing Sheets

(56) References Cited

U.S. PATENT DOCUMENTS

| | | | | |
|---|---|---|---|---|
| 6,972,968 B2* | 12/2005 | Hwang | ............... | H05K 9/0058 |
| | | | | 174/383 |
| 6,980,437 B2* | 12/2005 | Bright | ............... | H05K 7/20418 |
| | | | | 165/185 |
| 7,249,966 B2* | 7/2007 | Long | ............... | H01R 13/65802 |
| | | | | 439/490 |
| 7,365,923 B2 | 4/2008 | Hargis et al. | | |
| 7,452,216 B2* | 11/2008 | Murr | ................ | H01R 13/665 |
| | | | | 439/74 |
| 7,467,972 B2* | 12/2008 | Long | .................... | G02B 6/0001 |
| | | | | 439/490 |
| 7,525,798 B2 | 4/2009 | Schultz et al. | | |
| 7,957,133 B2* | 6/2011 | Zieman | ................ | G06F 1/20 |
| | | | | 312/236 |
| 8,465,320 B2* | 6/2013 | Long | .................. | G02B 6/0001 |
| | | | | 439/541.5 |
| 9,793,648 B2* | 10/2017 | Regnier | ............. | H05K 7/20509 |
| 2003/0159772 A1* | 8/2003 | Wolf | ................... | G02B 6/4277 |
| | | | | 156/182 |
| 2003/0161108 A1* | 8/2003 | Bright | ................. | G02B 6/4201 |
| | | | | 361/707 |
| 2005/0128709 A1* | 6/2005 | Fujiwara | ................ | G06F 1/203 |
| | | | | 361/704 |
| 2005/0176290 A1* | 8/2005 | Lichtscheidl | ........ | H01R 25/003 |
| | | | | 439/501 |
| 2007/0253168 A1 | 11/2007 | Miller | | |
| 2008/0285236 A1 | 11/2008 | Phillips et al. | | |
| 2009/0298349 A1* | 12/2009 | Filipon | .............. | H01R 13/6658 |
| | | | | 439/669 |
| 2012/0040560 A1* | 2/2012 | Wang | ................ | H01R 13/6658 |
| | | | | 439/607.31 |

\* cited by examiner

CONNECTOR SYSTEM WITH THERMAL COOLING

RELATED APPLICATIONS

This application claims priority to U.S. Provisional Application No. 61/556,890, filed Nov. 8, 2011 and to U.S. Provisional Application No. 61/640,786, filed May 1, 2012, both of which are incorporated herein by reference in their entirety.

FIELD OF THE INVENTION

The present invention relates to the field of connectors, more specifically to the field of connectors suited to manage thermal loads.

DESCRIPTION OF RELATED ART

I/O connectors, particularly connectors intended for high data rates, are known. One example of such a connector is commonly referred to as a QSFP connector. The QSFP connector is intended to provide a 10 Gbps data rate in a 4× configuration (four transmits and four receive channels). Other connectors that provide comparable data rates include Infiniband 12× connectors (intended to provide 10 Gbps in a 12× configuration) and SFP+ connectors (intended to provide 10 Gbps in a 1× configuration). Work is also underway to provide comparable interfaces at higher data rates (e.g., 16 Gbps or 28 Gbps channels).

As can be appreciated, these high data rates are highly beneficial and are being implemented to help address concerns about needed bandwidth in telecommunication and networking applications, as well as certain server applications. As can be expected based on these typical applications, there are two basic usage patterns. One usage pattern is to provide data from one location to another nearby location. All copper solutions tend to work well for these uses as the data is often moved less than 10 meters. Passive cable assemblies are well suited to such applications and tend to be cost effective. As distances increase, however, powered cables become necessary. For medium distances (such as less than 100 meters) active cables are often used and these cables still provide signals over copper conductors but the signal-to-noise (S/N) ratios are boosted so that attenuation that takes places as the high frequency signal travels along a length of conductor is managed. Finally, to transmit distances over greater distance (such as 1 kilometer) it makes sense to use to optical transmission medium. Those cables use a module on both ends that converts electrical signals to optical signals, thus enabling signaling over much greater distances. Thus, the two usage patterns are 1) a passive cable system; and 2) a powered cable system.

One significant issue with the powered cable system is that chips/modules used to transmit the signal through the corresponding cable require power. Significant energy can be required, often on the range of 3 watts for optical modules. This amount of thermal energy requires cooling in order to ensure the components used to transmit signals are not overheated. While cooling solutions are well known (for example, cooling solutions exist for CPUs that may have to dissipate more than 100 watts), the issue in cable assemblies is greatly complicated by the fact that the module that needs to be cooled requires a removable interface with the cooling solution. In other words, the module is inserted into a receptacle and must make appropriate contact (which is often a sliding contact) with the cooling solution such that sufficient thermal energy can be pulled away from the module.

One method of cooling that has been used for some time is a riding heat sink. This type of heat sink provides a flat surface that is intended to engage a module when the module is inserted into the receptacle. The flat surface that is biased against the surface of the module with a clip that secures the heat sink to the cage, thus the heat sink can move vertically to account for tolerances in the cage, heat sink and module. One issue with this design, however, is that it is difficult to provide a heat sink with a flat surface and the module also tends to be less than perfectly flat. Thus, as a practical matter, it is common for there to basically be three direct points of contact between heat sink and the module. As can be appreciated, therefore, certain individuals would appreciate an improved thermal management system.

BRIEF SUMMARY

A connector includes a heat spreader. The heat spreader is configured to direct heat from ports to a thermal plate that is spaced apart from the connector. In an embodiment, a box can support a plurality of connectors and provide two thermal plates and the heat spreader associated with each connector can direct thermal energy to both thermal plates. The heat spreader can be kept thin so as to ensure connectors can be positioned in a compact configuration. Cold blocks can be used to thermally couple the heat spreader to the corresponding thermal plates.

BRIEF DESCRIPTION OF THE DRAWINGS

The present invention is illustrated by way of example and not limited in the accompanying figures in which like reference numerals indicate similar elements and in which.

DETAILED DESCRIPTION

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity. In addition, it should be noted that certain features depicted herein are optional. Thermal management (and the associated system) often depends on the expected heat load. Thus, features that are intended to provide greater thermal handling capabilities may be omitted in embodiments where the thermal load is expected to be relatively low. In addition, for applications where the environment is relatively benign (for example, if the system was positioned in a location where very cool air is available) some of the features may be unnecessary to provide the desired thermal management performance.

Figure 1:
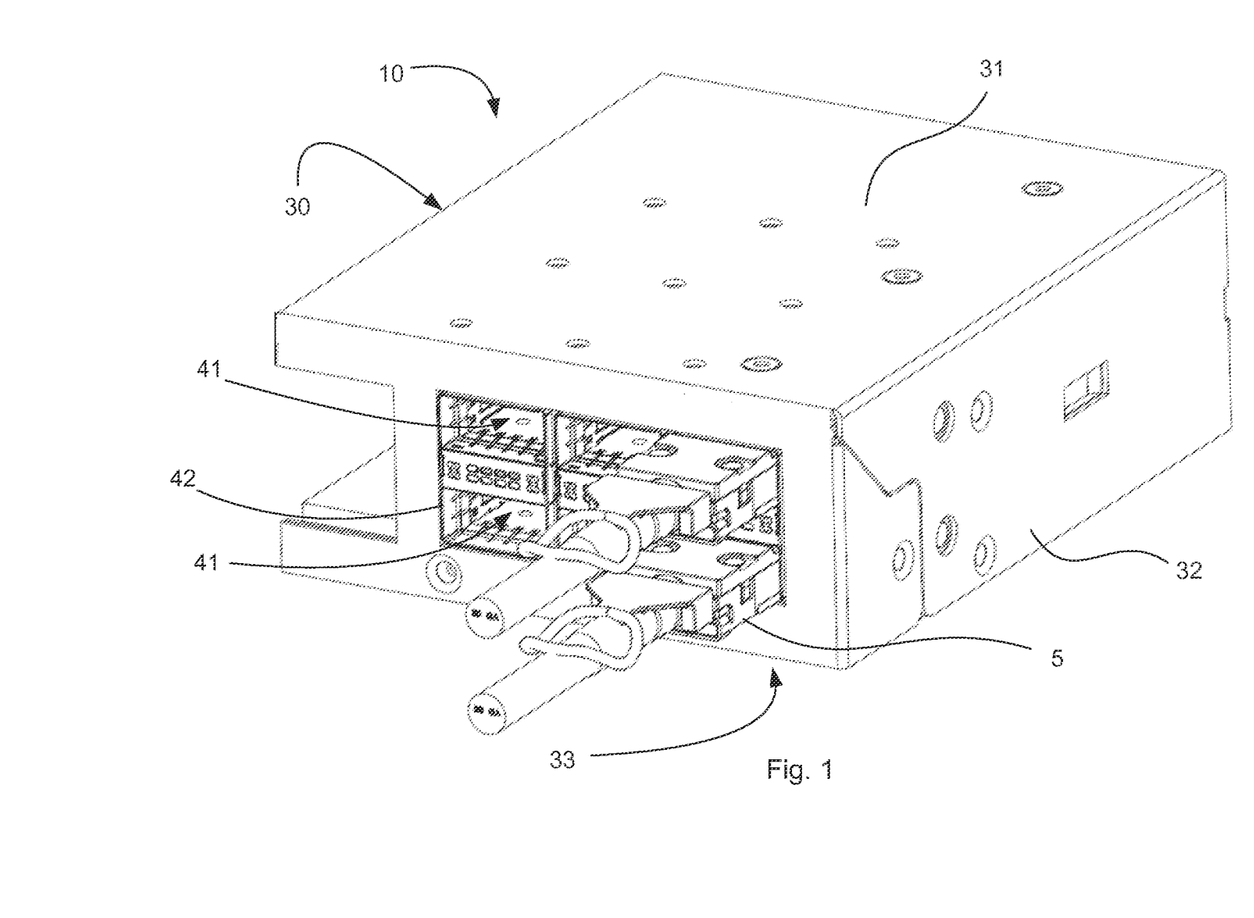
FIG. 1 illustrates a perspective view of an embodiment of a connector system.
Figure 2:
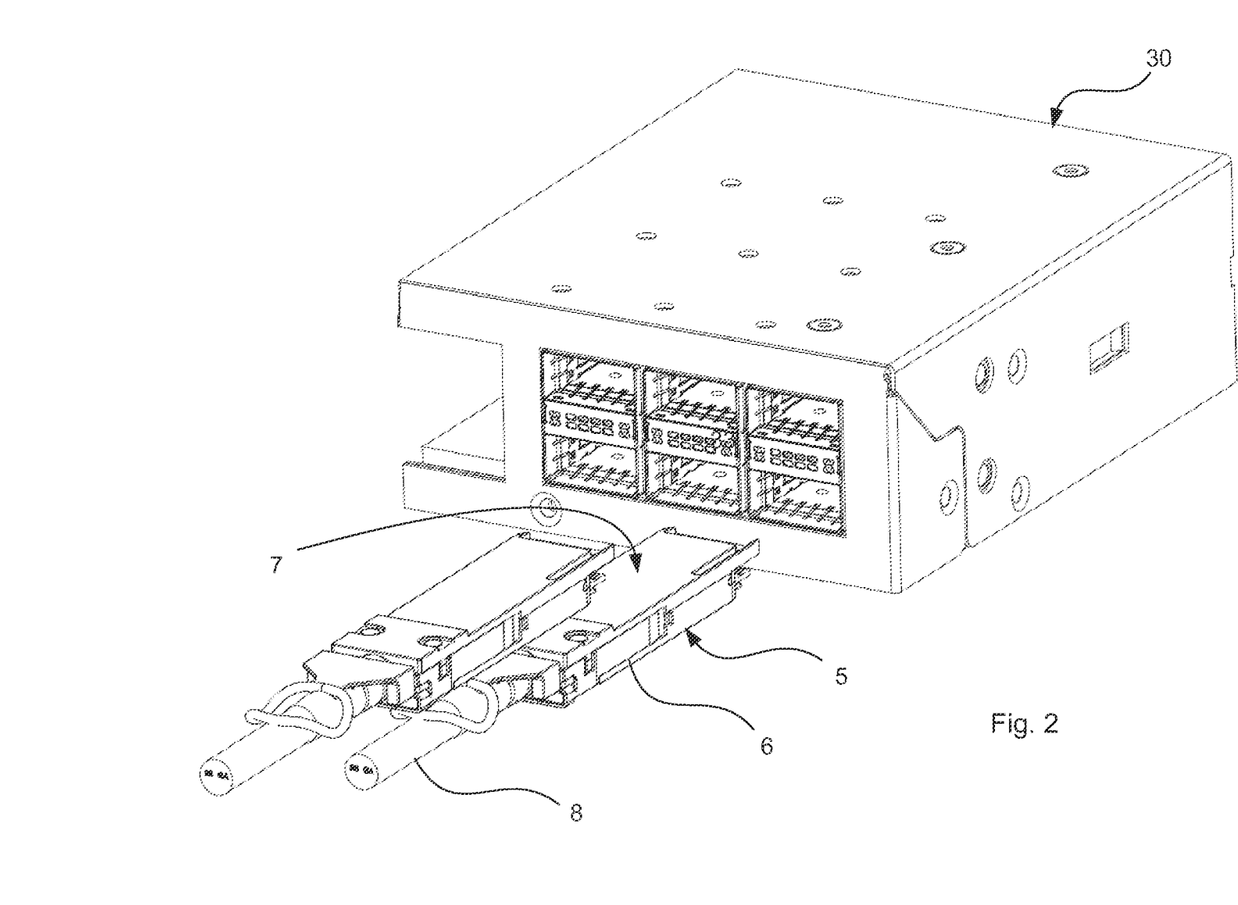
FIG. 2 illustrates a perspective view of the embodiment depicted in FIG. 1 with plug connectors in an unmated position.
Figure 3:
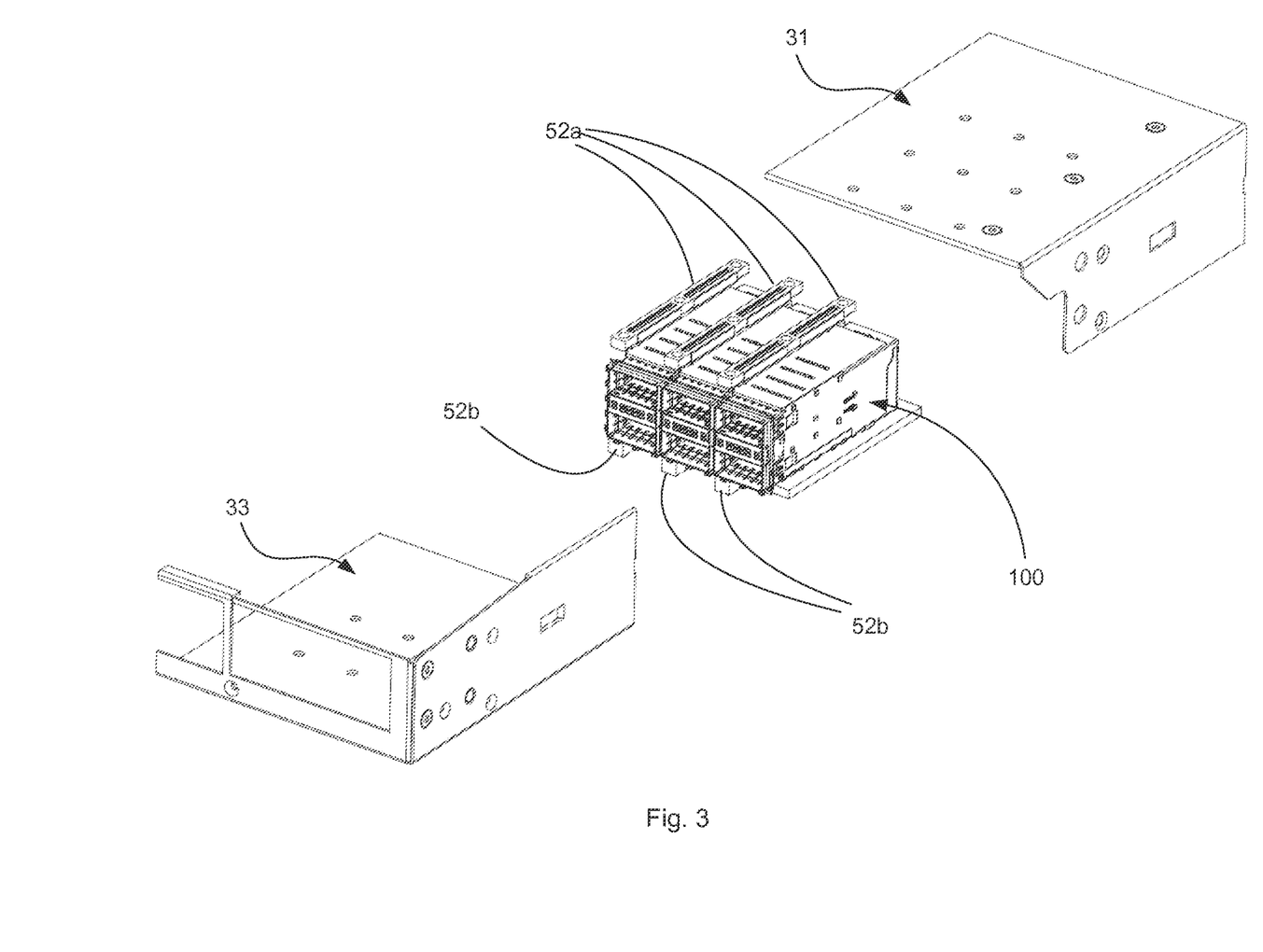
FIG. 3 illustrates a partially exploded perspective view of an embodiment of a connector system.
Figure 4:
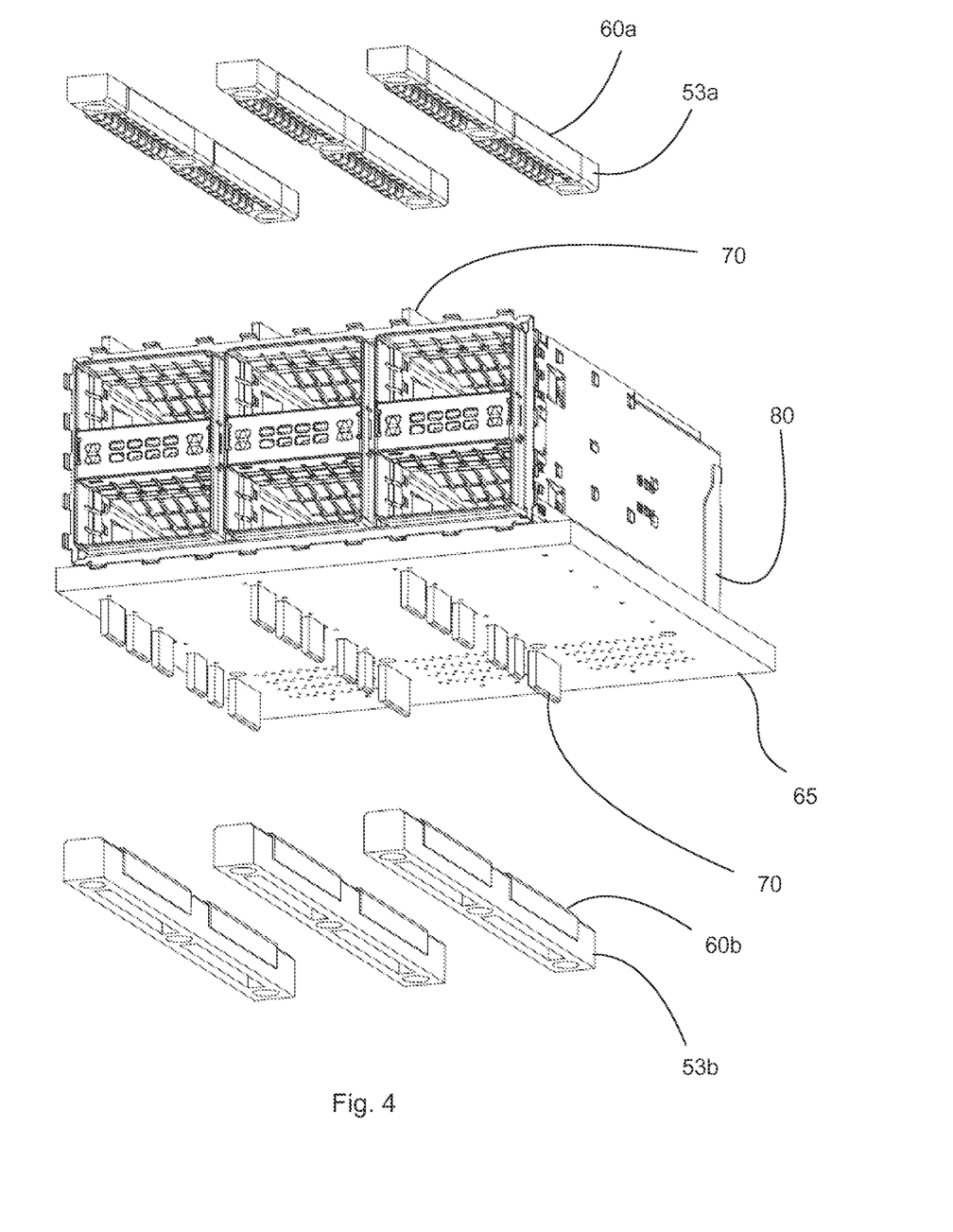
FIG. 4 illustrates a partially exploded perspective view of an embodiment of a simplified connector system.
Figure 5:
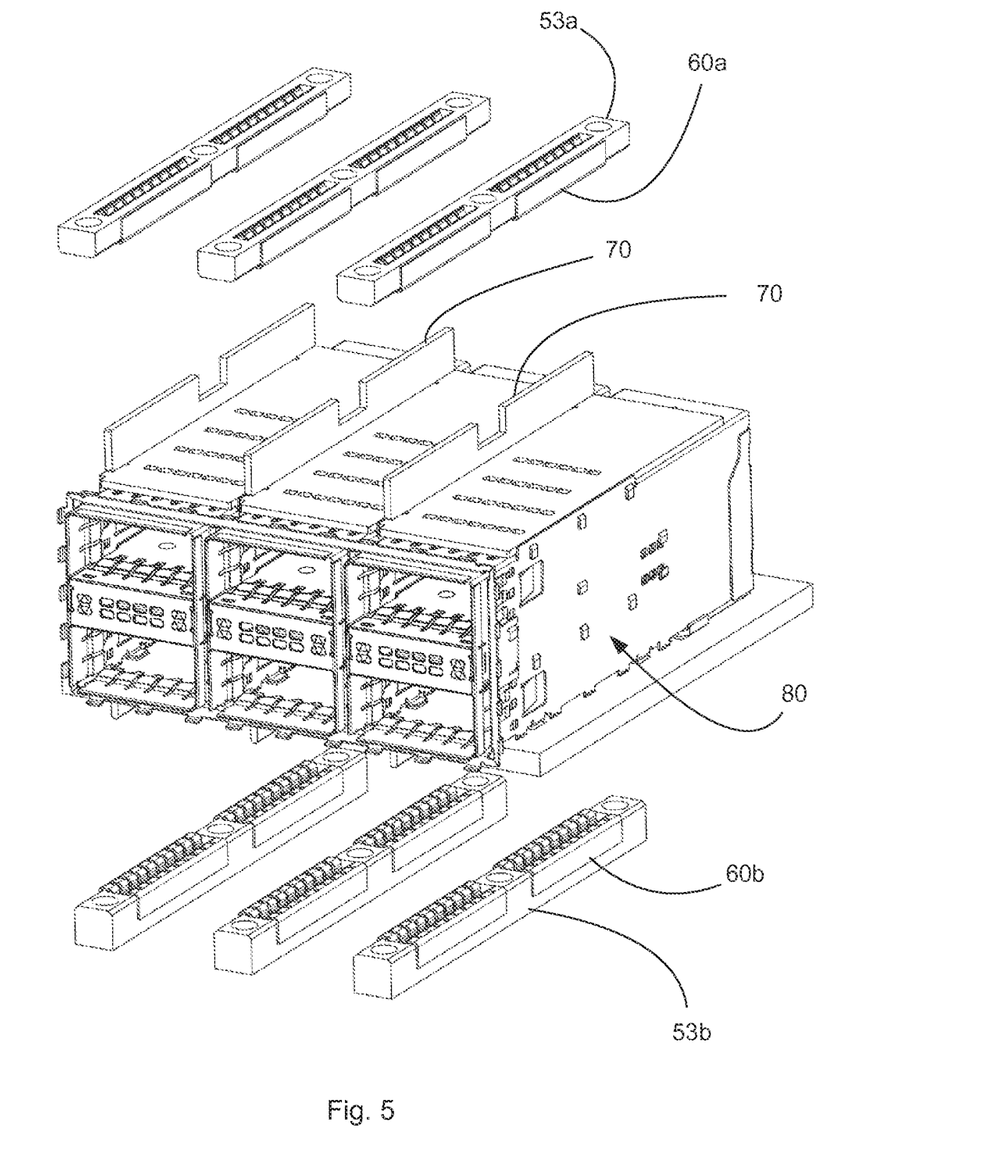
FIG. 5 illustrates another perspective view of the embodiment depicted in FIG. 4.

FIG. 1 illustrates a connector system that includes a box 30 with a first thermal plate 31, a side plate and a second thermal plate 33. It should be noted that while the thermal plates are depicted as being on the exterior of the box, the box could include additional plates and/or structure that would be positioned exterior to the depicted plates (thus the depicted thermal plates 31, 33 could be internal thermal plates). Regardless of the box design, one potential benefit of the design is that the box 30 can act as a heat sink. As the box 30 typically is substantially larger and often enjoys substantial air flow past the thermal plates, this provides a suitable mechanism for improved cooling performance.

The box 30 includes columns of ports 41 that are openings 42 in cage 80 and the ports 41 are configured to receive plug connectors 5 on the end of a signal cable 8 that include a shell 6 with a surface 7, which preferably is flat. The depicted configuration provides three separate connectors 100 that are positioned adjacent each other so as to minimize the amount of space and as depicted, the box 30 has upper cold blocks 52a mounted on upper thermal plate 31 and lower cold blocks b2b mounted on lower thermal plate 33 and one upper cold block 52a and one lower cold block 52b is associated with each connector. As can be appreciated, depending on the intended air flow patterns, in some embodiments it may be sufficient to have either the upper cold block 52a or just the lower cold block 52b (but not both) associated with each connector. Furthermore, each connector 100 can include a cage 80 that attached to a heat spreader 70 so that the connector assembly is provided as a single unit.

Cold blocks 52a, 52b include a mounting block 53a, 53b, which can be mounted to the thermal plates in a manner that provides a low thermal resistance between the thermal plate and the mounting block. For example, a thermal gasket 56 can be placed between the mounting blocks and the thermal plate so that when the mounting blocks are fastened in position the thermal resistance is kept at a desirable level, preferably below 2 C/W and more preferably below 1.5 C/W and in higher performing applications below 1.25 C/W.

Figure 6:
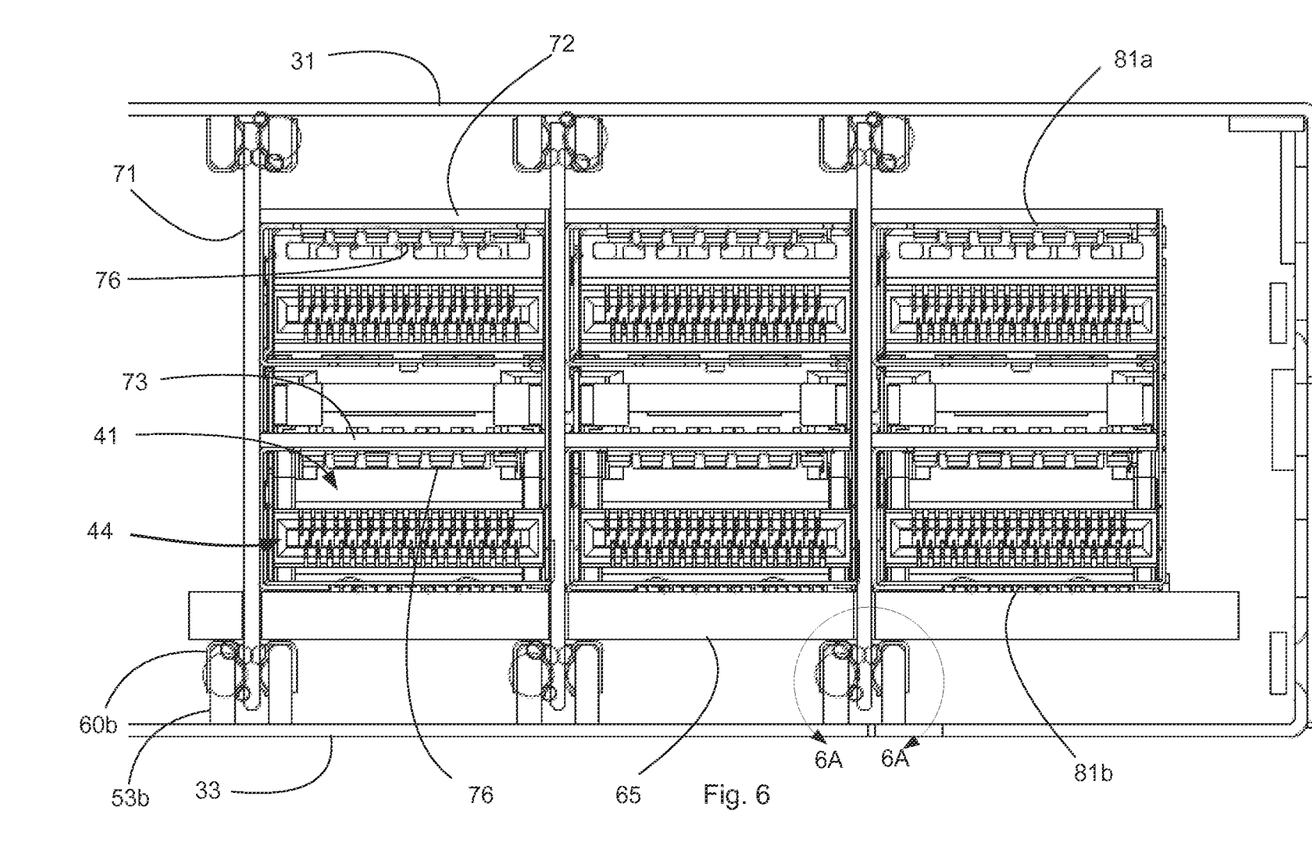
FIG. 6 illustrates an elevated front view of an embodiment of a connector system.
Figure 6A:
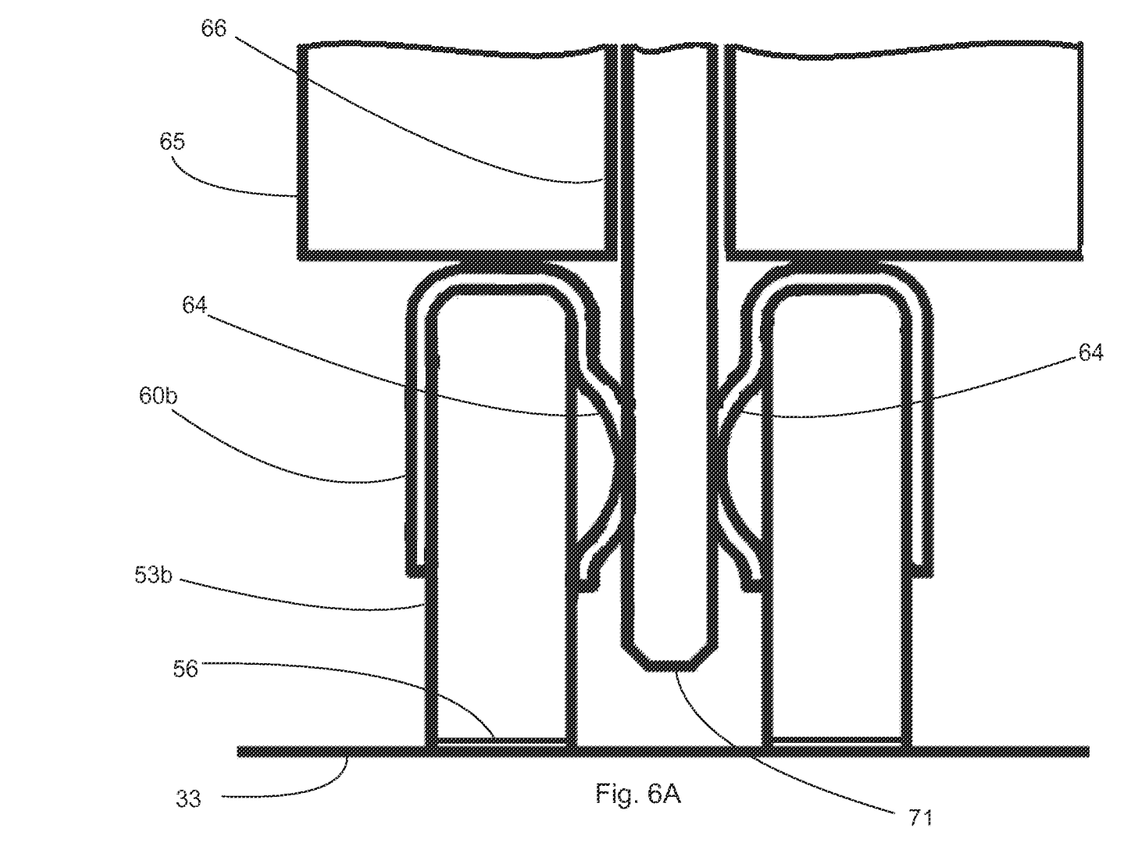
FIG. 6A illustrates an enlarged view of a portion of the embodiment depicted in FIG. 6, taken along the line 6A-6A.

Cold blocks 52a, 52b also include clips 60a, 60b mounted on the mounting blocks 53a, 53b and the clips have fingers 64 configured to engage the main thermal plate 71. As the fingers 64, which are shown as having an interference fit with the mounting blocks in FIG. 6A but in practice would be translated, press against the main thermal wall 71 they provide a number of parallel thermal channels that can conduct thermal energy from the main thermal wall 71 to a supporting plate, such as lower thermal plate 33. The clips 60a, 60b can be soldered to the mounting blocks so as to ensure a low thermal resistance between the two components. In another embodiment, the clips could be mounted directly on the thermal plate and the mounting blocks could be omitted. But in general the mounting blocks can provide additional surface that helps reduce the thermal resistance.

Figure 7:
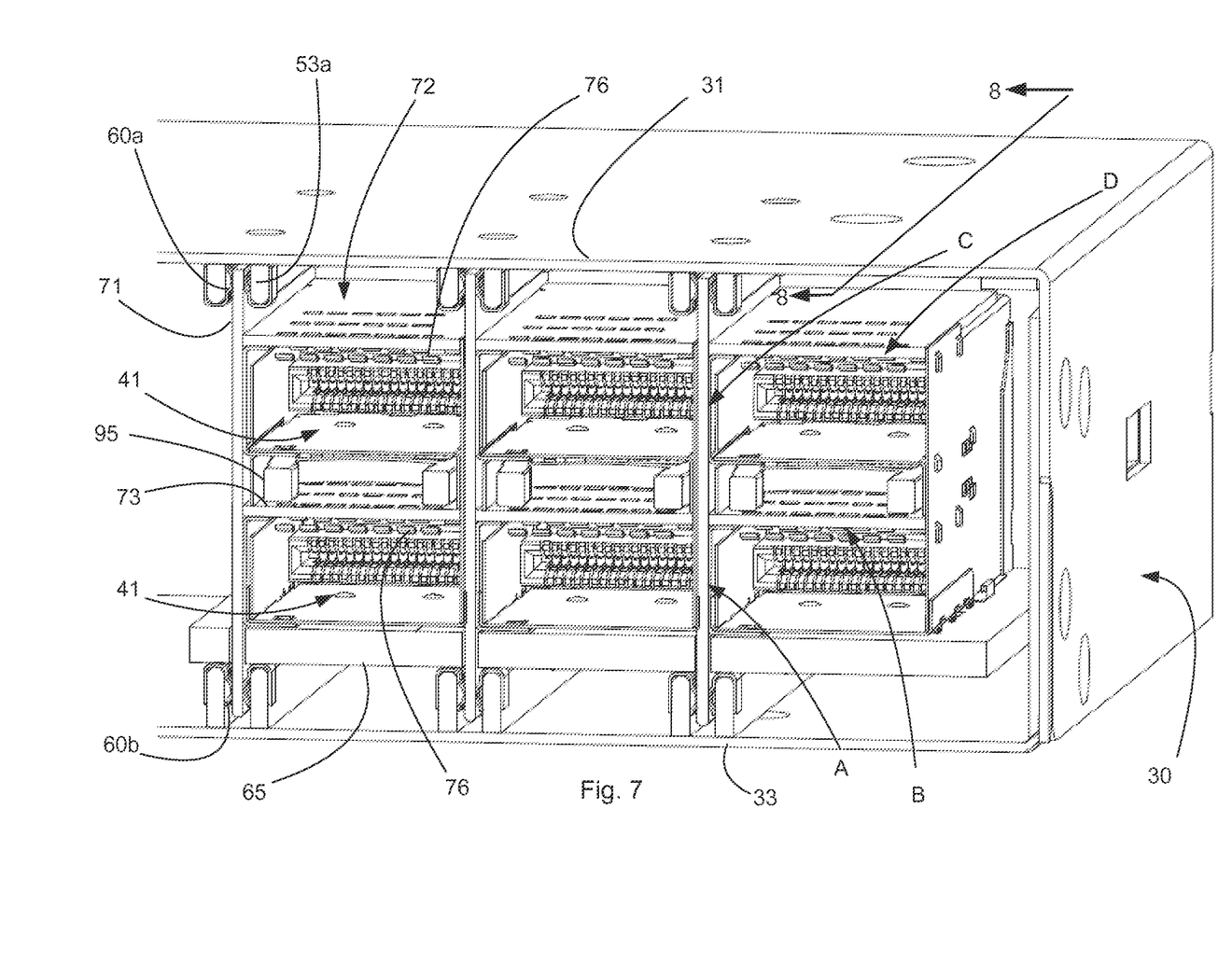
FIG. 7 illustrates a perspective view of an embodiment of a connector system.
Figure 8:
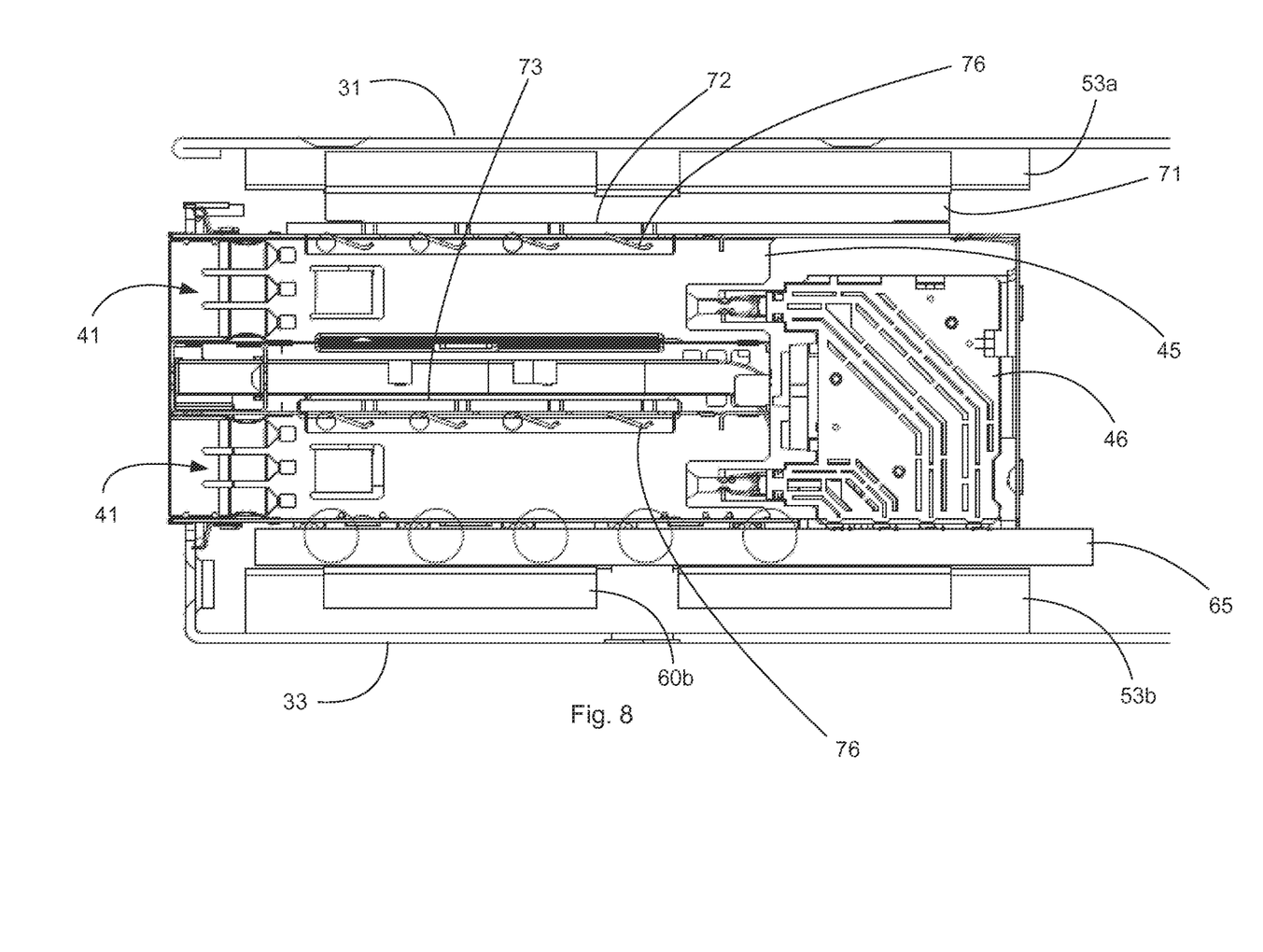
FIG. 8 illustrates an elevated side view of a cross-section of the embodiment depicted in FIG. 7, taken along line 8-8.
Figure 9:
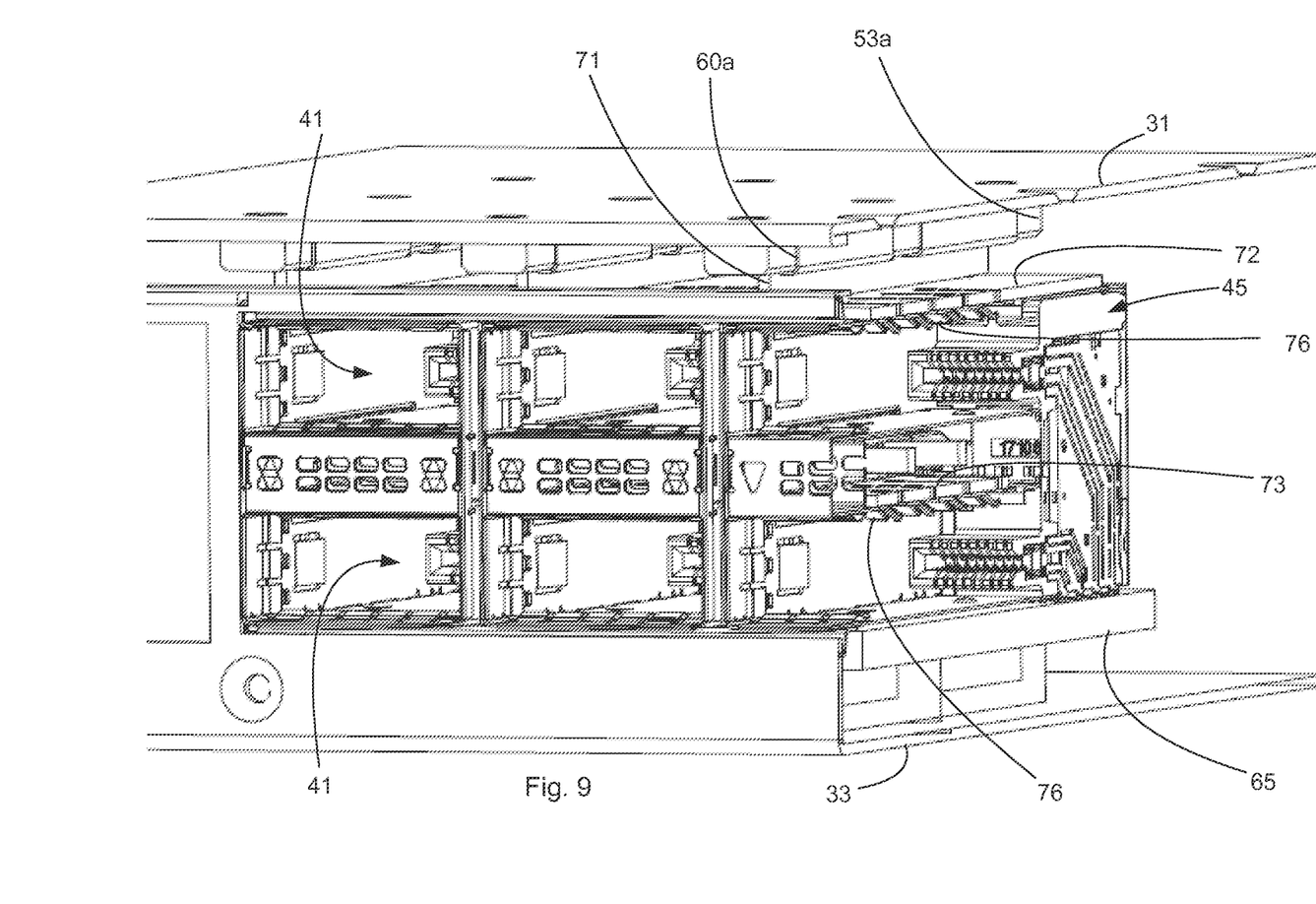
FIG. 9 a perspective view of the embodiment depicted in FIG. 8.
Figure 10:
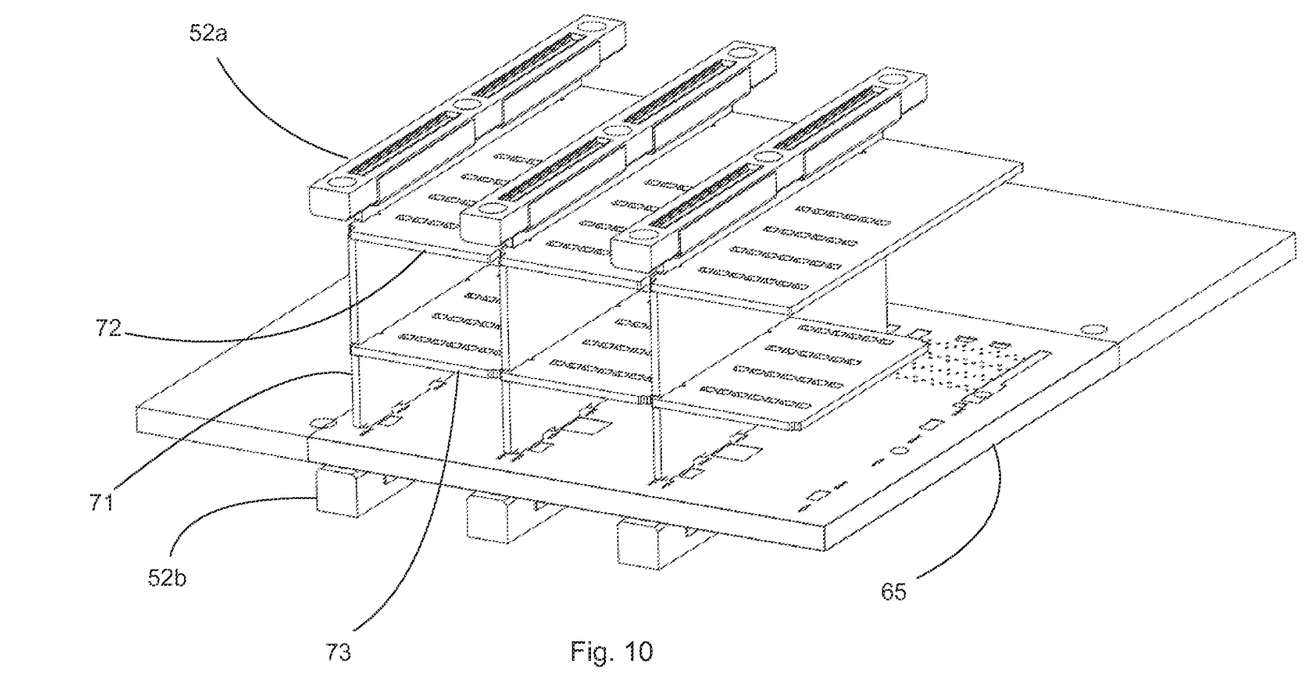
FIG. 10 illustrates a simplified perspective view of a two row thermal management system.

As can be appreciated from FIG. 7, a first and second thermal wall 73, 72 extend from the main thermal wall 71. In an embodiment, the main thermal wall 71 is aligned with a first side A of a first port and a first side C of the second port and the first thermal wall 73 is aligned with a second side B of the first port and the second thermal wall 72 is aligned with a second side D of the second port. As can be appreciated, the first thermal wall is positioned between the two ports 41 and the second thermal wall is not positioned between the two ports. Alternatively, the second thermal wall 72 could also be positioned between the two ports 41 but that would leave less room for items such as a light pipe 95 or other indicators that might be desirable to position therebetween.

It should be noted that the thermal walls can be fashioned as desired. For example, the thermal walls can be formed of a metal plate, a heat-pipe or some liquid filled structure. As can be appreciated, it is desirable to have a structure that is cost effective for the desired thermal resistance.

As depicted, a module that is inserted into a port will have a surface that is engaged by a plurality of thermal contacts 76. The thermal contacts 76 are thermally coupled to a first and second thermal plate 73, 72, which are thermally coupled to the main thermal plate 71, which engages the cold blocks. This allows a connector 45 with wafers 46 to couple to a plug connector to engage the card slots and have good EMI protection while allow for sufficient cooling in a relatively dense package.

Figure 11:
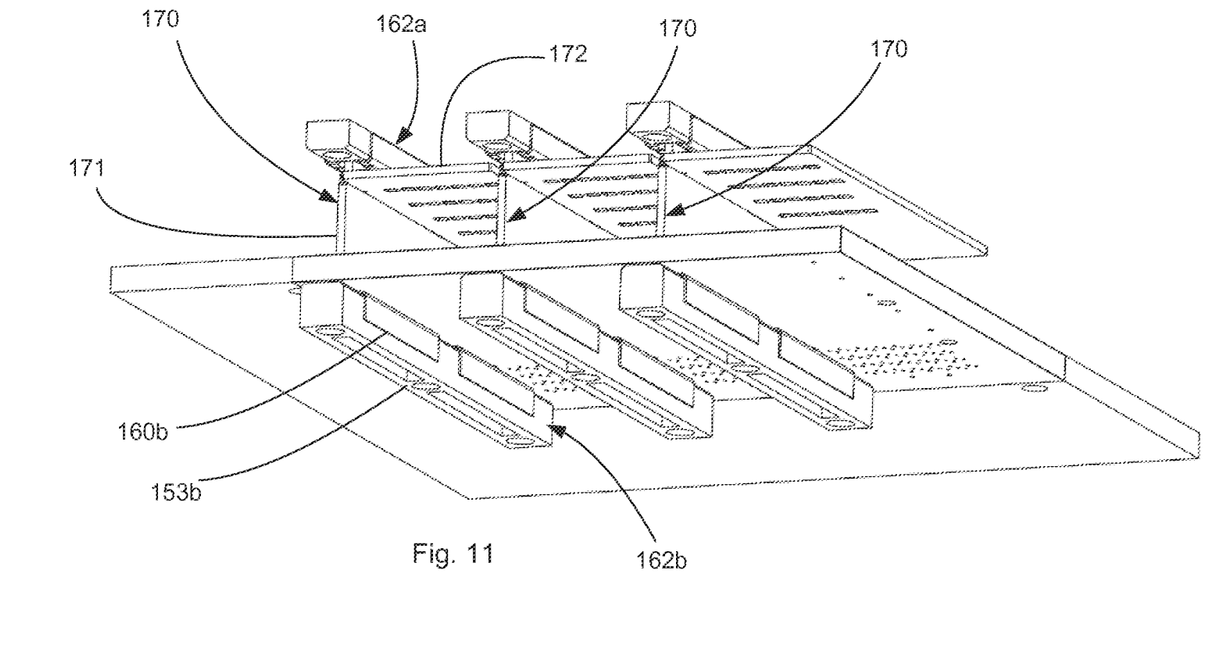
FIG. 11 illustrates a simplified perspective view of a one-row thermal management system.

As depicted in FIG. 11, a heat spreader 170 includes a main thermal wall 171 and a first thermal wall 172 extending from the main thermal wall 171. As can be appreciated, for maximum thermal performance two cold blocks 162a and 162b could be used (each having a mounting block and clip such as the depicted mounting block 153b and the clip 160b). In an alternative embodiment, however, the upper or lower cold block could be omitted. Regardless, the cold blocks providing a sliding thermal interface that allows for good thermal performance while avoid issues such as the stack-up that can be result from dimensional variations between the circuit board, the thermal plates (not shown) and the connector.

Thus, the depicted embodiments provide a way to offer lower thermal resistance (in an embodiment less than 1.5 C/W and preferably less than 1.25 C/W) between the cage and the thermal plates. Furthermore, the main thermal wall can extend through openings in the circuit board without significant impact to thermal performance. In addition, the design allows for dense configurations as the main thermal plate can add less than 3 mm and in an embodiment less than 2 mm of width. Thus the depicted thermal solution can provide superior thermal performance while only requiring 2-4 mm of additional space per column of connectors.

It should be noted that while the thermal plates 31,33 are depicted as part of the box 30, as noted above, the thermal plates could also be internal elements. For example, without limitation, the thermal plates could be positioned inside of a larger box. It should also be noted that the thermal plates need not be solid metal (which is typically used for heat spreaders) but could instead be a liquid cooled structure (or even a vapor chamber style heat sink) that are configured to use the liquid/vapor to help move and or dissipate the thermal energy away from the connector.

As can be appreciated, the thermal resistance adds up with each interface. In an embodiment, for example, the total resistance between the inserted connector and the thermal plate can be less than 8 C/W and in a more preferred embodiment can be configured to provide 6 C/W or less of thermal resistance. If care is exercised, a system can be designed that provide a thermal resistance that is not more than about 4 C/W.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

I claim:

1. A connector system comprising:
a cage configured, in operation, for mounting on a top surface of a circuit board that also has an aperture and a bottom surface, the cage having an opening that defines a first port, the first port being positioned entirely above the top surface;
a plurality of wafers positioned in the cage, the plurality of wafers forming at least one card slot aligned with the first port;
a heat spreader configured, in operation, to be thermally coupled to a surface of a mating plug connector and to draw heat from the surface of the mating plug connector, the heat spreader further configured, in operation, to extend from above the top surface of the circuit board, through the circuit board, and below the bottom surface of the circuit board; and
a heat sink assembly positioned below the bottom surface and making direct contact below the bottom surface of the circuit board with the heat spreader, the heat sink assembly configured, in operation, to draw heat from the heat spreader.

2. The connector system as recited in claim 1, wherein the heat spreader comprises a thermal wall.

3. The connector system as recited in claim 1, wherein the heat sink assembly comprises a thermal plate.

4. The connector system as recited in claim 1, wherein the heat sink assembly comprises a block.

5. The connector system as recited in claim 1, wherein the heat sink assembly comprises a clip.

6. A connector system comprising:
a cage configured, in operation, for mounting on a top surface of a circuit board that also has an aperture and a bottom surface, the cage having an opening that defines a first port, the first port being positioned entirely above the top surface;
a connector positioned in the cage having a card slot aligned with the first port;
a heat spreader configured, in operation, to be thermally coupled to a surface of a mating plug connector and to draw heat from the surface of the mating plug connector, the heat spreader further configured, in operation, to extend from above the top surface of the circuit board, through the aperture of the circuit board, and below the bottom surface of the circuit board; and
a heat sink positioned below the bottom surface of the circuit board and in direct contact with the heat spreader, the heat sink configured, in operation, to draw heat from the heat spreader.

7. The connector system as recited in claim 6, wherein the heat spreader comprises a thermal wall.

8. The connector system as recited in claim 6, wherein the heat sink comprises a thermal plate.

9. The connector system as recited in claim 6, wherein the heat sink comprises a block.

10. A connector system comprising:
a cage configured, in operation, for mounting on a top surface of a circuit board that also has an aperture and a bottom surface, the cage having an opening that defines a first port, the first port being positioned entirely above the top surface;
a connector positioned in the cage having a card slot aligned with the first port;
a heat spreader configured, in operation, to be thermally coupled to a surface of a mating plug connector and to draw heat from the surface of the mating plug connector, the heat spreader further configured, in operation, to extend from above the top surface of the circuit board, through the aperture of the circuit board, and below the bottom surface of the circuit board; and
a heat sink assembly positioned below the bottom surface and making direct contact below the bottom surface of the circuit board with the heat spreader, the heat sink assembly configured, in operation, to draw heat from the heat spreader.

11. The connector system as recited in claim 10, wherein the heat spreader comprises a thermal wall.

12. The connector system as recited in claim 10, wherein the heat sink assembly comprises a thermal plate.

13. The connector system as recited in claim 10, wherein the heat sink assembly comprises a block.

14. The connector system as recited in claim 10, wherein the heat sink assembly comprises a clip.

* * * * *